United States Patent [19]

Akagiri et al.

[11] 4,441,084
[45] Apr. 3, 1984

[54] NOISE REDUCTION CIRCUIT

[75] Inventors: Kenzo Akagiri; Masayuki Katakura, both of Yokohama; Motomi Ookouchi, Tokyo, all of Japan

[73] Assignee: Sony Corporation, Tokyo, Japan

[21] Appl. No.: 300,432

[22] Filed: Sep. 8, 1981

[30] Foreign Application Priority Data

Sep. 9, 1980 [JP] Japan ............................ 55-123966

[51] Int. Cl.³ .......................... H03F 1/26; H03G 3/18
[52] U.S. Cl. .................................... 330/149; 330/284
[58] Field of Search .............. 330/86, 126, 104, 149, 330/151, 278, 284, 302; 328/145; 307/493; 333/14

[56] References Cited

U.S. PATENT DOCUMENTS 4,004,253 1/1977 Takasaki et al. ................ 330/151
4,080,580 3/1978 Takasaki et al. ................ 330/151

Primary Examiner—James B. Mullins
Assistant Examiner—Gene Wan
Attorney, Agent, or Firm—Lewis H. Eslinger; Alvin Sinderbrand

[57] ABSTRACT

A noise reduction circuit for use in an audio signal recording/reproducing apparatus is comprised of a first signal path including a voltage-controlled amplifier for amplifying a signal supplied thereto with controllable gain and integrating circuit for integrating at least that portion of the signal passing through the voltage-controlled amplifier within the audio range; a level detecting circuit for controlling the gain of the voltage-controlled amplifier in response to the level of the signal passing through the voltage-controlled amplifier; a feedforward resistor connected in parallel with the first signal path for providing a lower limit to the gain imparted to the signal supplied to the noise reduction circuit; an adder circuit for adding the output signals from the first signal path and the feedforward resistor; a second resistor or a low-pass filter connected as a negative feedback path between the output of the adder circuit and the input of the first signal path for providing an upper limit to the gain imparted to the signal supplied to the noise reduction circuit; and an anti-limiting circuit connected in parallel with the first signal path for compensating the signal supplied to the noise reduction circuit when the level of the signal is abruptly increased.

16 Claims, 14 Drawing Figures

NOISE REDUCTION CIRCUIT

BACKGROUND OF THE INVENTION

1. Field of the Invention

This invention relates generally to information signal recording and reproducing apparatus and, more particularly, is directed to a noise reduction circuit for reducing noise generally accompanying a reproduced information signal in an information signal recording and reproducing apparatus.

2. Description of the Prior Art

Compandor type noise reduction circuits for reducing noise and distortion which accompany a reproduced information signal are well-known in the art. Such noise reduction circuits are designed to increase the dynamic range of the signal that can be recorded and reproduced from a recording medium such as a magnetic tape. As an example, noise reduction circuits which increase the dynamic range of the signal by approximately 10 dB in the high frequency region by means of level compression and a complementary level expansion of the high frequency components of the input signal supplied thereto, are disclosed in the U.S. Pat. No. 3,631,365 to Dolby and U.S. Pat. No. 3,911,371 to Nakamura et al., the latter having a common assignee herewith.

Generally, these noise reduction circuits use a variable filter circuit which includes a variable resistance element constituted, for example, by an FET or a bipolar junction transistor, to effect the aforementioned compression and expansion operations. However, the use of a variable filter circuit imposes restrictions upon the design of the noise reduction circuit. For example, because of the discrete elements used with the aforementioned transistors, it becomes difficult, if not impossible, to design such variable filter circuits as integrated circuits. Also, the aforementioned transistors used in the variable filter circuits have a temperature dependency which, in many instances, is difficult to control and which may, in fact, cause a direct current shift due to, for example, the resultant changing resistance of the transistor with temperature. This may result in changes or fluctuations in the frequency characteristic of the circuit. Further, the above noise reduction circuits are not interchangeable, that is, an information signal recorded with the Dolby circuit must be reproduced only with the Dolby circuit. In addition to the above restrictions on circuit design, it is difficult to obtain a variable resistance element having precise characteristics. This means that it becomes difficult to improve the desirable characteristics of the noise reduction circuit, whereby the dynamic range thereof can only be increased by approximately 10 to 20 dB.

OBJECTS AND SUMMARY OF THE INVENTION

Accordingly, it is an object of this invention to provide an improved circuit for noise reduction that avoids the above-described difficulties encountered with the prior art.

More particularly, it is an object of this invention to provide a circuit for noise reduction that can be used in an information signal recording and/or reproducing system.

It is another object of this invention to provide a circuit for noise reduction that provides a high degree of freedom in the design of the circuit.

It is still another object of this invention to provide a circuit for noise reduction that can be readily interchanged with other types of noise reduction circuits.

It is yet another object of this invention to provide a circuit for noise reduction that uses a voltage controlled amplifier having highly precise and controllable characteristics.

It is a further object of this invention to provide a circuit for noise reduction that reduces fluctuations in the frequency characteristic thereof and reduces any direct current shift over that of prior art noise reduction circuits so as to greatly increase the dynamic range of the circuit.

It is still a further object of this invention to provide a circuit for noise reduction that is relatively simple in construction and inexpensive to manufacture and use.

In accordance with an aspect of this invention, a circuit for noise reduction includes a first signal path including variable gain amplifier means for amplifying a signal supplied thereto with controllable gain, and integrating means for integrating at least a portion of the signal passing through the variable gain amplifier means; first means connected with the first signal path for providing a lower limit to the gain imparted to a signal supplied to said circuit; and second means connected with the first signal path for providing an upper limit to the gain imparted to the signal supplied to said circuit.

In a preferred embodiment of this invention, the signal supplied to the first signal path is also supplied to the first means which is constituted by a resistive feedforward path and the output of the feedforward path is combined with the output of the first signal path to produce the output signal of the noise reduction circuit. The second means includes a resistive feedback path supplied with the output signal of the noise reduction circuit and which negatively feeds back this signal to the input of the first signal path.

The above, and other, objects, features and advantages of the present invention will become readily apparent from the following detailed description of the illustrative embodiments of the invention which is to be read in connection with the accompanying drawings.

DETAILED DESCRIPTION OF THE PREFERRED EMBODIMENTS

Figure 1:
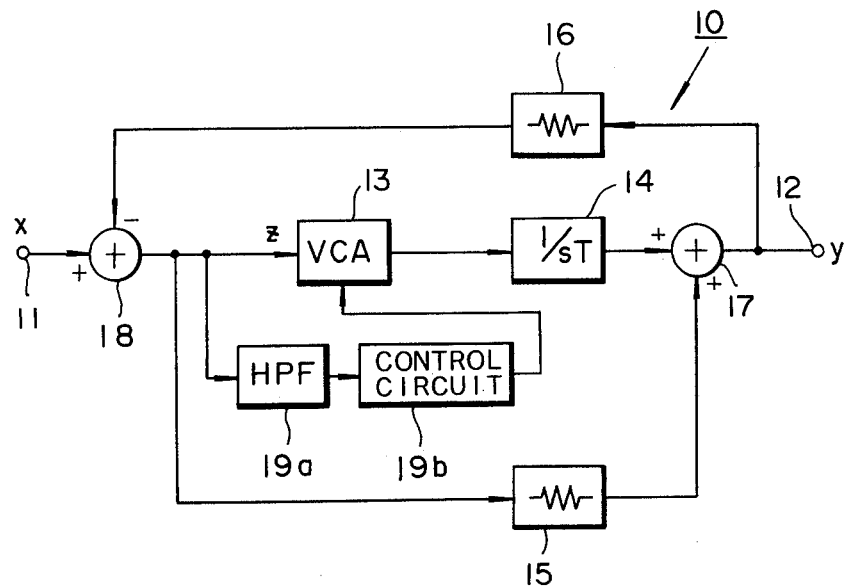
FIG. 1 is a block diagram of a noise reduction circuit according to a basic embodiment of the present invention.

Referring to the drawings in detail, and initially to FIG. 1 thereof, there is shown a noise reduction circuit according to a basic embodiment of the present invention which can be used as a decoder circuit on the output side of an audio signal recording and/or reproducing apparatus for effecting a level expansion operation. As shown therein, a reproduced encoded signal, such as an audio signal from a tape recorder, is supplied through an input terminal 11 thereof to an adding or positive input of a subtraction circuit 18. The output from subtraction circuit 18 is supplied to a first signal path comprised of a series connection of a variable gain amplifier 13 and an integrating circuit 14. Variable gain amplifier 13 may be a voltage controlled amplifier (VCA) which amplifies the output of subtraction circuit 18 with a variable gain. In particular, the gain of amplifier 13 is directly related to the signal level of the audio input signal supplied thereto such that the gain thereof is relatively high when the input level is relatively high and conversely, the gain thereof is relatively low when the input level is relatively low. This is achieved by a control path comprised of a high-pass filter 19a and a control circuit 19b, the latter circuit supplying a control voltage to voltage controlled amplifier 13 for controlling the gain thereof. High-pass filter 19a functions as a weighting circuit for weighting the signal supplied thereto in accordance with the frequency thereof, and control circuit 19b may be comprised of a level detecting circuit which detects the level of and smooths the signal from high-pass filter 19a to obtain the control voltage which is supplied to a control terminal of voltage controlled amplifier 13. In this manner, control circuit 19b controls the gain of amplifier 13 so that the gain thereof is increased for high level input signals and is decreased for low level input signals. Integrating circuit 14 integrates at least that portion of the output signal from variable gain amplifier 13 that is within the audio frequency band. The output from integrating circuit 14 is then supplied to an adding input of an adder circuit 17.

A second signal or feedforward path 15 having a flat frequency characteristic, that is, one which is independent of frequency, is connected in parallel with the first signal path constituted by variable gain amplifier 13 and integrating circuit 14, through adder circuit 17. Feedforward path 15 essentially provides no gain control and may be comprised merely of a resistor. In particular, feedforward path 15 is also supplied with the output from subtraction circuit 18 and, in turn, supplies an output signal to a second adding or positive input of adder circuit 17. As will be discussed in greater detail hereinafter, feedforward path 15 functions to provide or determine a lower limit to the amount of gain imparted to the audio signal passing through the noise reduction circuit for high frequencies thereof. Adder circuit 17 produces the output signal for noise reduction circuit 10 at output terminal 12 thereof.

Further, a third signal or feedback path 16 having a substantially flat frequency characteristic is connected in parallel with the first signal path through subtraction circuit 18. In other words, feedback path 16 essentially provides no gain control to the signal supplied thereto and may be constituted, for example, merely by a resistor. Feedback path 16 is supplied with the decoded output signal from adder circuit 17 and, in turn, supplies an output signal to the subtracting or negative input of subtraction circuit 18 where it is subtracted from the input signal from input terminal 11. As will be discussed in greater detail hereinafter, feedback path 16 functions to provide or determine an upper limit to the amount of gain imparted to the audio signal passing through the noise reduction circuit for low frequencies thereof. The resultant signal produced by subtraction circuit 18 is then supplied in the input of variable gain amplifier 13.

With noise reduction circuit 10, if the level of the input signal supplied to input terminal 11 is designated by x, the level of the output signal from output terminal 12 is designated by y, the level of the output signal from subtraction circuit 18 is designated by z, the gain of variable gain amplifier 13 is designated by G, the transfer characteristic of integrating circuit 14 is designated by $1/sT$, where $s = j\omega$ and T is a predetermined constant value, the transfer function of feedforward path 15 is designated by $F_L$ and the transfer function of feedback path 16 is designated by $F_H$, the following equations can be developed which define the relationships between the first, second and third signal paths:

$$y = \left( G \cdot \frac{1}{sT} + F_L \right) \cdot z \quad (1)$$

$$z = x - F_H y. \quad (2)$$

Equations (1) and (2) can be combined to form an equation for the level y of the output signal as a function of the level x of the input signal, as follows:

$$y = \frac{1}{F_H} \cdot \frac{1 + sT \cdot F_L \cdot \frac{1}{G}}{1 + sT \cdot \frac{1 + F_H F_L}{F_H} \cdot \frac{1}{G}} \cdot x \quad (3)$$

Figure 2:
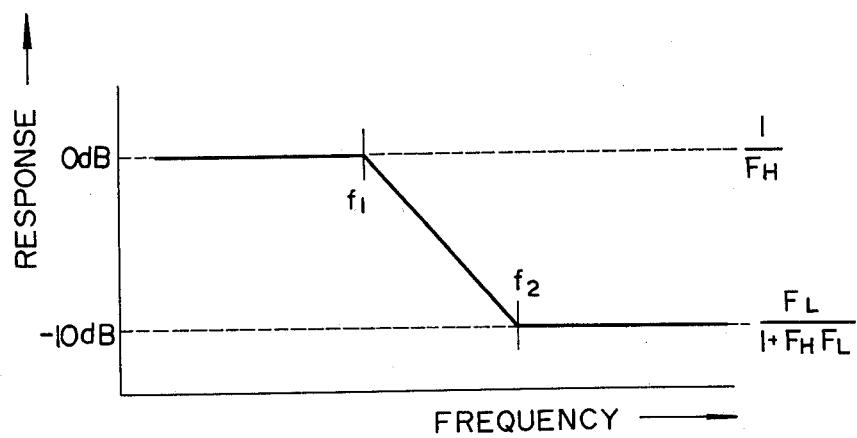
FIG. 2 is a graphical diagram illustrating the frequency-response characteristic of the noise reduction circuit of FIG. 1.

A graphical representation of equation (3) is shown in FIG. 2. As shown therein, the resultant curve has two turn-over frequencies $f_1$ and $f_2$ corresponding to the upper and lower limits of gain imparted to the signal passing through noise reduction circuit 10, in which the turn-over frequencies are expressed by the following equations:

$$f_1 = 1/(2\pi T_1) \tag{4}$$

and $$f_2 = 1/(2\pi T_2) \tag{5}$$

where time constants $T_1$ and $T_2$ are expressed by the following equations:

$$T_1 = T \cdot \frac{1 + F_H F_L}{F_H} \cdot \frac{1}{G} \tag{6}$$

$$T_2 = T \cdot F_L \cdot \frac{1}{G} \tag{7}$$

When equations (4)-(7) are substituted into equation (3), the lower limit of the gain imparted by noise reduction circuit 10 is equal to $F_L/(1+F_H F_L)$ and the upper limit of the the gain is equal to $1/F_H$. As shown in FIG. 2, the upper limit of the gain is set at 0 dB for illustration purposes only and occurs for frequencies at or below the lower turn-over frequency $f_1$. In like manner, the lower limit of the gain in FIG. 2 is set at −10 dB for illustration purposes only and occurs for frequencies at or above the other turn-over frequency $f_2$. Also, the slope of the curve between the turn-over frequencies $f_1$ and $f_2$ is determined by the characteristic of integrating circuit 14.

Figure 3:
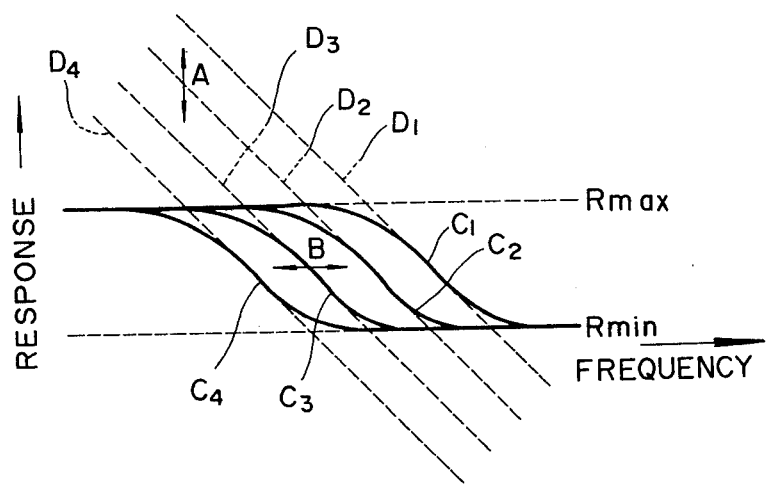
FIG. 3 is a graphical diagram illustrating the variable frequency-response characteristic of the noise reduction circuit of FIG. 1.

It should be appreciated that the frequency-response characteristic of noise reduction circuit 10 changes with variations in the gain of variable gain amplifier 13, in the manner shown by the curves in FIG. 3. In particular, integrating circuit 14 has a straight line characteristic with a fixed response slope, for example, 6 dB/octave in which the response or output therefrom decreases with increasing frequencies of the signal supplied thereto. The straight line curve for integrating circuit 14 is shifted in the direction of arrow A in FIG. 3 with variations in the gain G of variable gain amplifier 13 so as to produce a variable integrating characteristic shown by dashed line curves $D_1$, $D_2$, $D_3$ and $D_4$. In particular, the dashed line integrating curves of FIG. 3 are shifted in the direction from curve $D_1$ to $D_4$ as the gain G of variable gain amplifier 13 is reduced. However, the lower and upper limits $R_{min}$ and $R_{max}$ of response, that is, the lower and upper limits of gain imparted by noise reduction circuit 10, which are determined by feedforward path 15 and feedback path 16, respectively, remain constant during the aforementioned shifting of curves $D_1$ to $D_4$. This means that the overall frequency-response curve C of noise reduction circuit 10, between turn-over frequencies $f_1$ and $f_2$, is shifted in the direction of arrow B of FIG. 3, as shown by solid line curves $C_1$ to $C_4$ corresponding to integrating curves $D_1$ to $D_4$, respectively. It should be appreciated from equations (4)-(7) that the ratio $f_1/f_2$ of the turn-over frequencies, and therefore, the ratio $T_2/T_1$ of the corresponding time constants are constant regardless of changes in the gain G of variable gain amplifier 13. In this manner, a so-called sliding band effect is produced in which there is a shift in curve C in the direction of the frequency axis, that is, in the direction of arrow B of FIG. 3, in accordance with the gain G of variable gain amplifier 13, and with a constant turn-over frequency ratio $f_1/f_2$ being maintained. In other words, variations of the gain G of variable gain amplifier 13 do not affect the upper and lower limits of response $R_{max}$ and $R_{min}$, but only vary the location of the transition band between turn-over frequencies $f_1$ and $f_2$.

Figure 4:
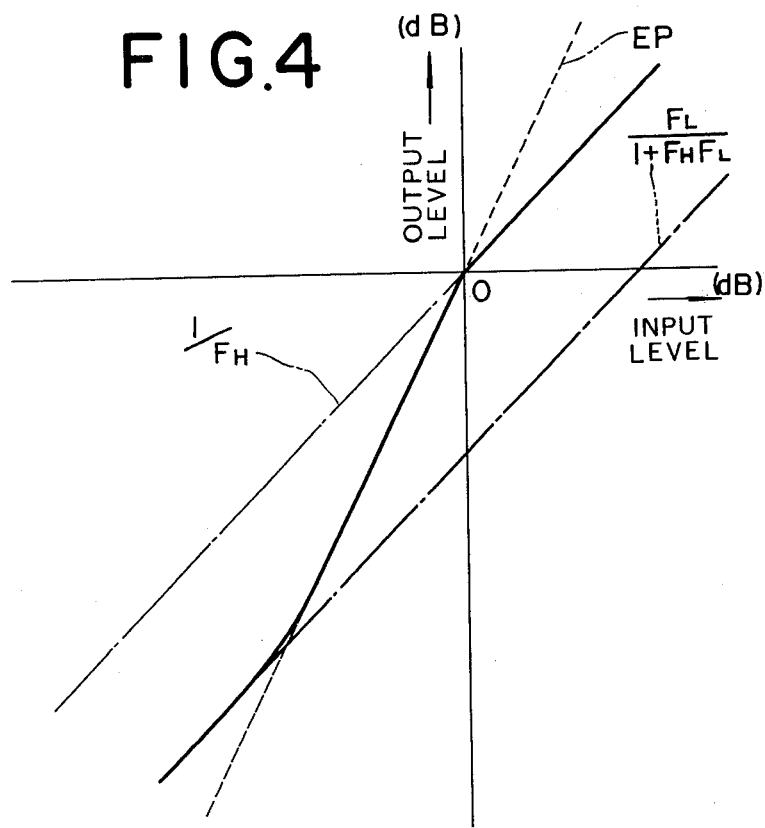
FIG. 4 is a graphical diagram illustrating the input-output level characteristic of the noise reduction circuit of FIG. 1.

The level expansion characteristic of noise reduction circuit 10 is illustrated by the curve shown in FIG. 4. In particular, as shown therein, the reference input and output levels are each set at 0 dB and the level expansion characteristic of variable gain amplifier 13 is shown by dashed line EP. As the level of the input signal to noise reduction circuit 10 decreases, the gain G of variable gain amplifier 13 is also reduced until the lower limit $R_{min}$ of response is obtained as a result of feedforward path 15, as indicated by the dot-dash line $F_L/(1+F_H F_L)$ in FIG. 4. Conversely, when the level of the input signal to noise reduction circuit 10 is increased, the gain G of variable gain amplifier 13 is likewise increased until the upper limit $R_{max}$ is achieved as a result of feedback path 16, as indicated by the dot-dash line $1/F_H$ in FIG. 4. In this manner, the overall input-output characteristic of noise reduction circuit 10 is shown by the solid line curve in FIG. 4.

It will be appreciated that the present invention provides distinct advantages over the aforementioned prior art noise reduction circuits. In particular, fluctuations in the frequency characteristics due to the use of a variable resistance element, such as an FET or bi-polar junction transistor, is substantially reduced by the present invention so as to reduce the amount of any direct current shift. Also, problems of leakage current through such FET or bi-polar junction transistor are substantially reduced by using a voltage controlled amplifier according to this invention which provides highly precise and controllable characteristics and a wide variable gain range.

It should be appreciated that various modifications can be effected with the connections of the individual elements of the noise reduction circuit of FIG. 1 while still maintaining the aforementioned desirable characteristics. For example, the positions of variable gain amplifier 13 and integrating circuit 14 in the first signal path can be interchanged, that is, it is only important that integrating circuit 14 integrate the signal passing through variable gain amplifier 13. In addition, the signal supplied to the control path constituted by high-pass filter 19a and control circuit 19b may be taken from any point in the first signal path. For example, high-pass filter 19a may be connected to either the input or output of variable gain amplifier 13 or may even be supplied with a signal corresponding to the sum or difference of the input and output signals to and from variable gain amplifier 13. Further, in accordance with this invention, although feedforward path is connected in parallel with the first signal path to provide a minimum gain or lower limit to the gain of the circuit when the level of the input signal supplied thereto is extremely low, this may alternatively be accomplished by providing a minimum gain setting to the control signal from control circuit 19b or by providing feedforward path 15 with a low-pass filter characteristic.

Figure 5:
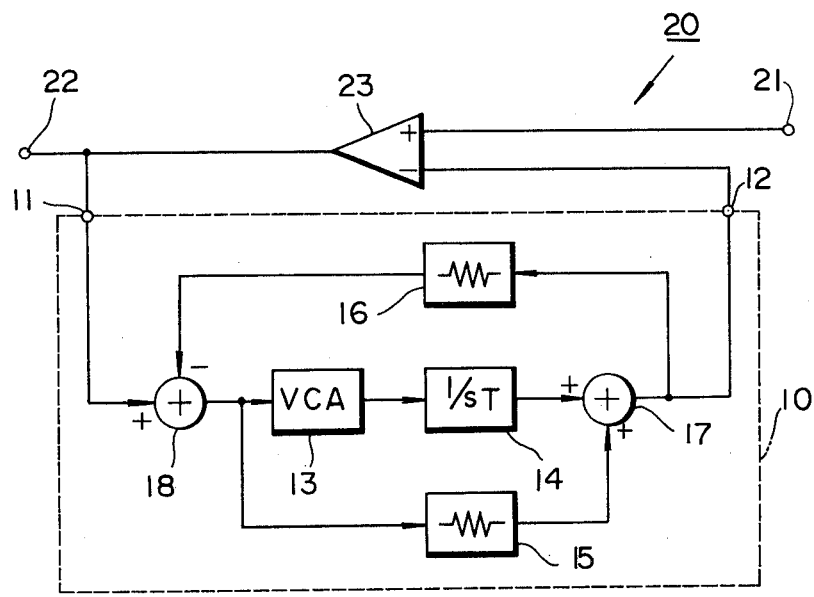
FIG. 5 is a block diagram of a noise reduction circuit according to another embodiment of the present invention.

Although noise reduction circuit 10 has been used as a decoder circuit for providing level expansion of information signals which have been recorded, for example, on a magnetic tape, such circuit can be used as an encoder circuit with level compression which is complementary to the corresponding characteristics of the aforementioned noise reduction circuit 10 of FIG. 1. As illustrated more particularly in FIG. 5, an encoding noise reduction circuit 20 includes noise reduction circuit 10 connected in the negative feedback path of an operational amplifier 23. In such case, operational amplifier 23 has a non-inverting input coupled to an input terminal 21 to receive an input signal to be recorded, and an inverting input coupled to the output terminal 12 of noise reduction circuit 10. The output of amplifier 23 is coupled to input terminal 11 of noise reduction circuit 10 and to an output terminal 22. In this manner, noise reduction circuit 10 is connected as a negative feedback circuit from the output of the inverting input of amplifier 23 as described above, so as to produce level compressed information signals at output terminal 22. Thus, an input information signal from, for example, a microphone or receiver, is supplied through input terminal 21 and encoded and then supplied to output terminal 22 to be recorded on a record medium by a recording transducer such as a magnetic recording head. The elements and connections of noise reduction circuit 10 between input terminal 11 and output terminal 12 thereof are identical to those in FIG. 1 and a detailed description thereof will not be repeated herein for the sake of brevity. Also, the control path of noise reduction circuit 10 is not shown in FIG. 5 for the sake of brevity.

In operation, the transfer function H of noise reduction circuit 10, that is, when used in its decoding mode, is designated by H and is used as the negative feedback gain for amplifier 23. If the open loop gain of amplifier 23 is represented as A, then the overall gain or transfer function U of noise reduction circuit 20 is obtained as follows:

$$U = \frac{A}{1 + AH}. \quad (8)$$

This, of course, is the gain of an amplifier having negative feedback. Now, if the gain A of amplifier 23 is very high, that is, the product AH is sufficiently large so that $AH \gg 1$, then the gain or transfer characteristic of circuit 20 is approximately equal to 1/H. Thus, when circuit 10 is connected as a negative feedback circuit to amplifier 23, the overall characteristic of noise reduction circuit 20 is converse, or complimentary to the decoder transfer characteristic H. Hence, it is appreciated that, when circuit 10 is used with amplifier 23 in its encoding mode, a level compressed signal having a characteristic which is complementary to the decoder characteristic is produced for recording on the record medium.

Figure 6:
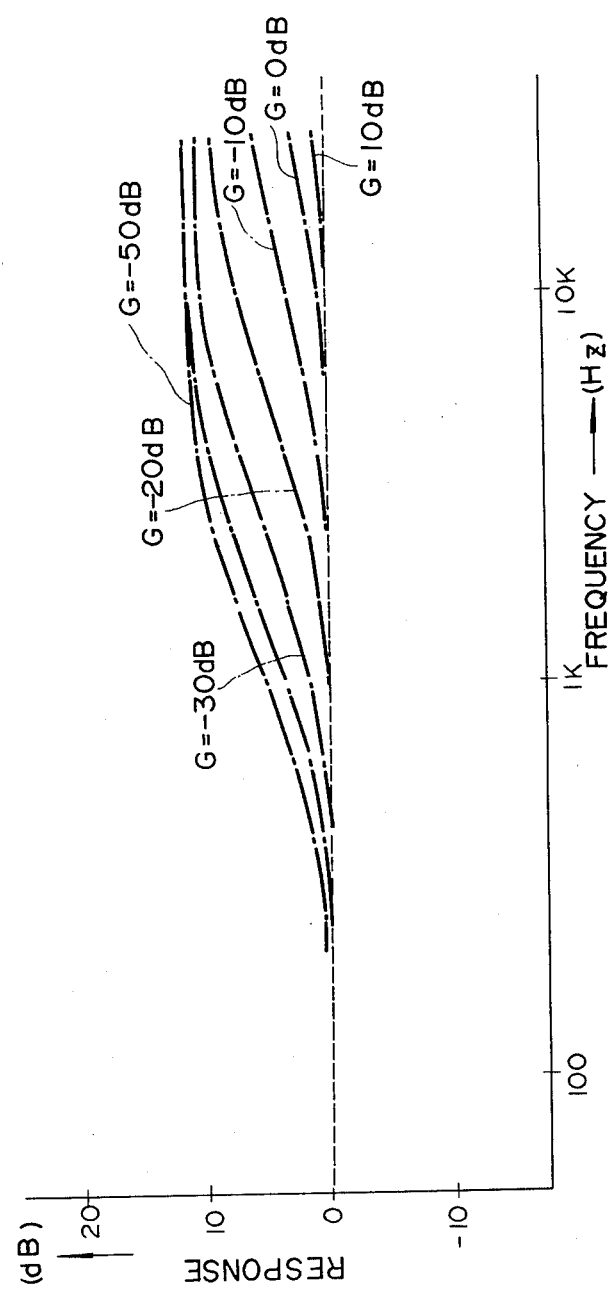
FIG. 6 is a graphical diagram illustrating the frequency-response characteristic of the noise reduction circuit of FIG. 5 for various gains of the VCA used therein.

FIG. 6 shows the frequency-response characteristic for noise reduction circuit 20. In particular, the response curves of FIG. 6 were obtained with a two-signal input, that is, with a first reference signal having the desired gain and a frequency of, for example, 400 Hz, to set the gain of variable gain amplifier 13, and a second sweeping signal superimposed thereon which had its frequency varied in the range shown in FIG. 6. The various curves were obtained with values of the gain G of variable gain amplifier 13 ranging from −50 dB to 10 dB. With these values, the responses or transfer functions of feedforward path 15 and feedback path 16 were set at −9.5 dB and 0 dB, respectively. It should be appreciated that the curves produced by noise reduction circuit 20 of FIG. 5 and shown in FIG. 6 have the aforementioned sliding band effect and accordingly, provide the same advantages of the aforementioned decoder circuit of FIG. 1.

Figure 7:
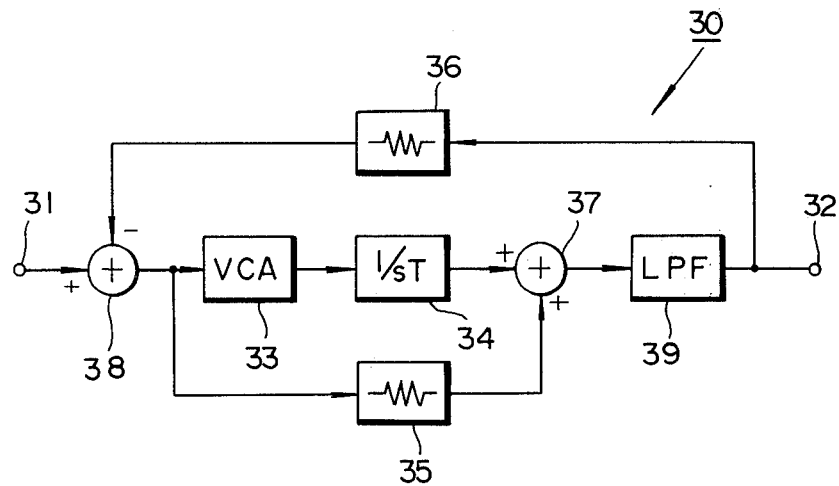
FIG. 7 is a block diagram of a noise reduction circuit according to another embodiment of the present invention.

Referring now to FIG. 7, there is shown another embodiment of a noise reduction circuit 30 according to this invention, in which elements 31–38 correspond identically in structure and function to elements 11–18 described above with reference to noise reduction circuit 10 of FIG. 1, and a detailed description thereof will be omitted herein for the sake of brevity. In particular, a reproduced audio signal is supplied to the adding input of a subtraction circuit 38 through an input terminal 31. The output of subtraction circuit 38 is supplied through a first signal path comprised of a variable gain amplifier 33 and an integrating circuit 34, to an adding input of an adder circuit 37. In addition, the output of subtraction circuit 38 is supplied through a feedforward path 35, which is identical to feedforward path 15 of FIG. 1, and the output of feedforward path 35 is supplied to another adding input of adder circuit 37. The output of adder circuit 37 is supplied to an output terminal 32 of noise reduction circuit 30 through a low pass filter 39. The output of low-pass filter 39 is supplied to a negative or subtracting input of subtraction circuit 38 through a feedback path 36, which is identical to feedback path 16 of FIG. 1. The control path for variable gain amplifier 33 has been omitted from the figure for the sake of brevity but it should be appreciated that such control path is identical to that shown in FIG. 1 which is comprised of high-pass filter 19a and control circuit 19b.

Low-pass filter 39 cooperates with integrating circuit 34 to vary the frequency emphasis characteristic of the circuit in order to increase the slope of the frequency-response characteristic thereof, that is, to provide a high frequency de-emphasis (low frequency emphasis) characteristic. This results in an increased separation of signals in the low and intermediate frequency region from signals in the high frequency region, which has the effect of reducing noise modulation. With noise modulation, noise components are varied as a function of input signal level variations. As shown by the solid line in FIG. 8A, the frequency-response characteristic of low-pass filter 39 has a cut-off or turn-over frequency $f_c$ in the high frequency region of the audio signals and rises towards the low frequency region with a slope of, for example, 6 dB/octave.

Figure 8:
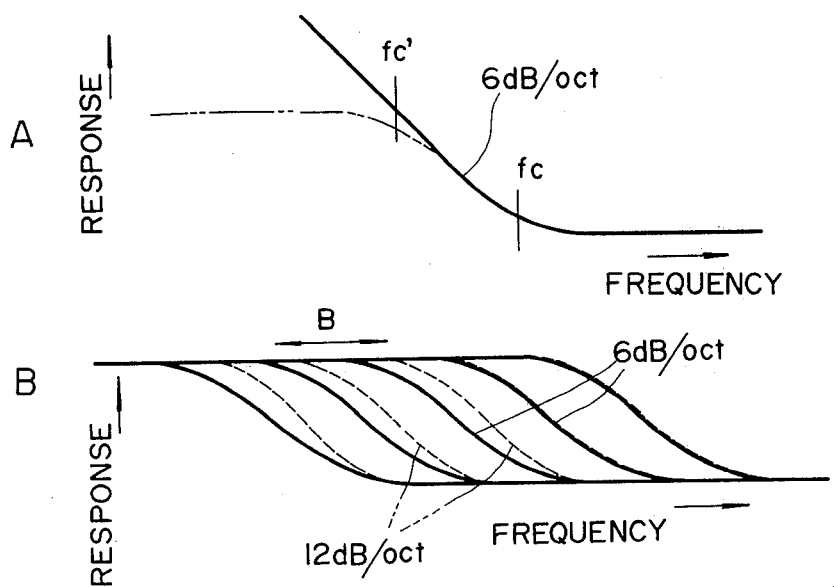
FIG. 8A is a graphical diagram illustrating the frequency-response characteristic of the low-pass filter of the noise reduction circuit of FIG. 7.
FIG. 8B is a graphical diagram illustrating the variable frequency-response characteristic of the noise reduction circuit of FIG. 7.
Figure 9:
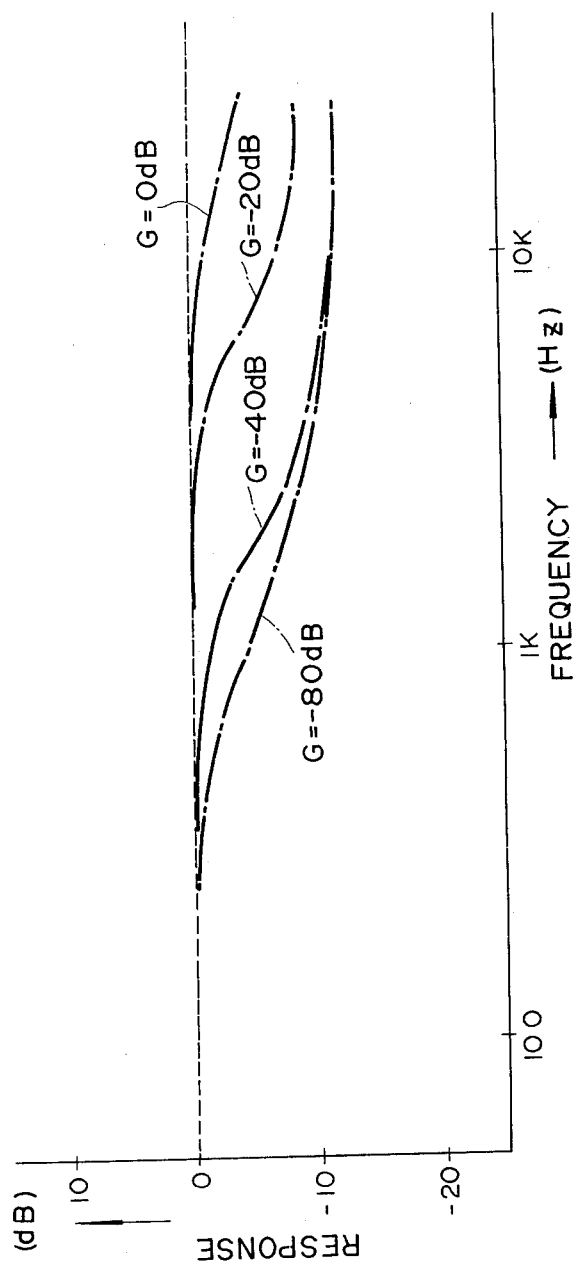
FIG. 9 is a graphical diagram illustrating the frequency-response characteristic of the noise reduction circuit of FIG. 7 for various gains of the VCA used therein.

Referring now to FIG. 8B, there is shown the variable frequency-response characteristic for the circuit of FIG. 7 which is similar to the characteristic shown in FIG. 3 for the circuit of FIG. 1. As with the curves of FIG. 3, the curves in FIG. 8B are shifted in the direction of the frequency axis, that is, in the direction of arrow B thereon, in accordance with variations in the gain G of variable gain amplifier 33. Further, the frequency-response characteristics of low-pass filter 39, shown in FIG. 8A, and of the remainder of circuit 30, shown by the solid line curves in FIG. 8B, are combined in noise reduction circuit 30, whereby to increase the slope of each of the solid line curves in FIG. 8B, as shown by the dashed line curves thereon having a slope, for example, of 12 dB/octave. It is to be noted that the resultant curves of FIG. 8B contain a dip that results from the increased phase shift from low-pass filter 39. This effect may be eliminated by providing a second cut-off or turn-over frequency $f'_c$ for low-pass filter 39 at the low frequency end of the audio range, as shown by the dot-dash line in FIG. 8A. By using a low-pass filter 39 having two turn-over frequencies of, for example, 1 KHz and 3.16 KHz, and with the response of feedback path 36 being set at 0 dB and the response of feedforward path 35 being set at −9.5 dB, as with the circuit of FIG. 5, the frequency-response characteristic of noise reduction circuit 30 is shown in FIG. 9 when the gain G of variable gain amplifier 33 is set at 0, −20, −40 and −80 dB. It should be appreciated from the curves of FIG. 9 that steep response slopes are obtained when the gain G is equal to −40 dB and −20 dB so as to reduce any noise modulation.

Figure 10:
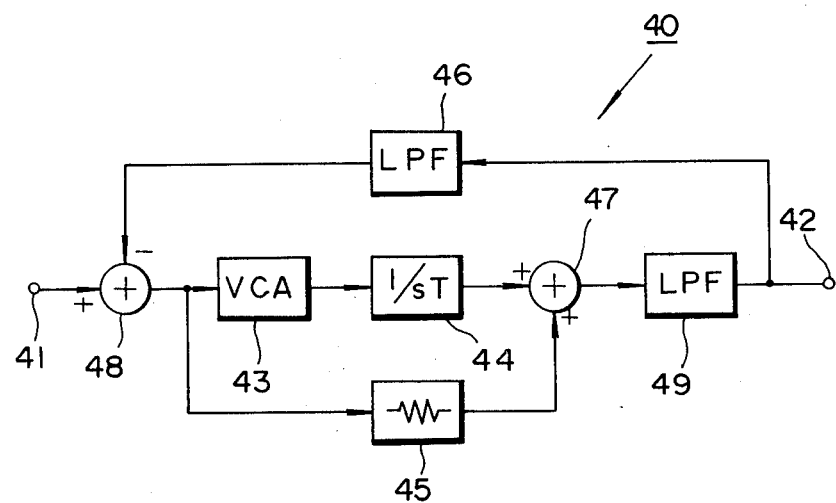
FIG. 10 is a block diagram of a noise reduction circuit according to another embodiment of the present invention.
Figure 11:
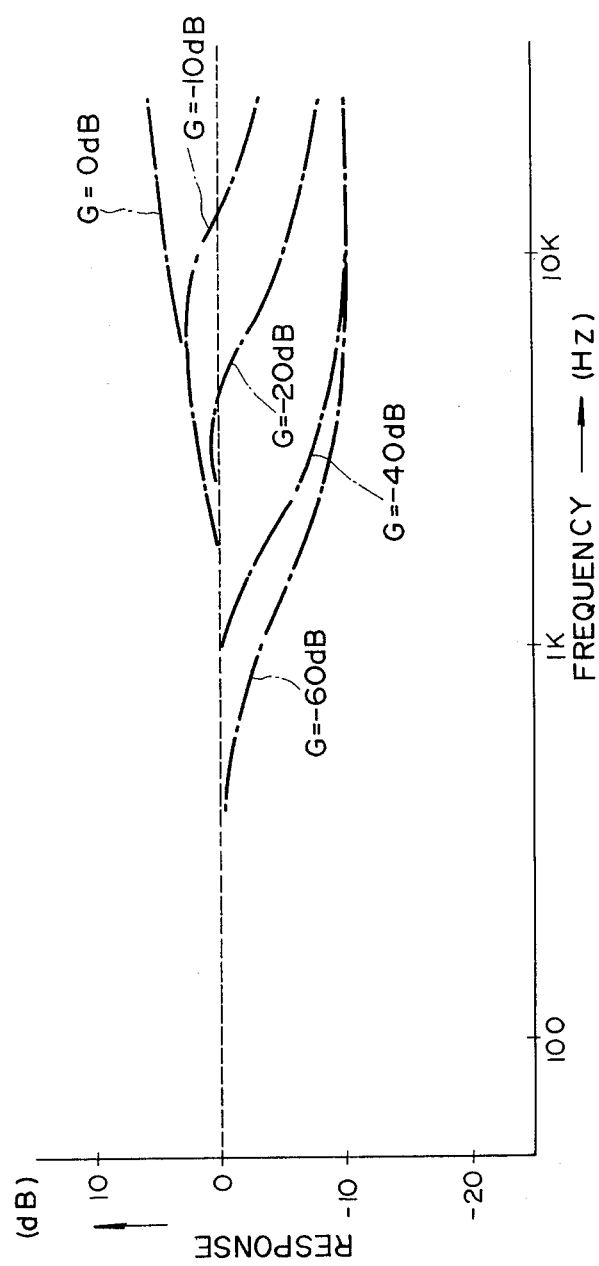
FIG. 11 is a graphical diagram illustrating the frequency-response characteristic of the noise reduction circuit of FIG. 10 for various gains of the VCA used therein.

Referring now to FIG. 10, there is shown another embodiment of noise reduction circuit 40 according to this invention which can be used as a decoder circuit, and in which elements 41–45 and 47–49 are identical in structure and function to the corresponding elements 31–35 and 37–39, respectively, in the circuit of FIG. 7. Accordingly, a detailed description of these elements will be omitted herein for the sake of brevity. With noise reduction circuit 40, rather than using a linear resistive element, such as that used in feedback path 36 of noise reduction circuit 30, feedback path 46, which is connected between the output of low-pass filter 49 and the negative or inverting input of subtraction circuit 48, is constituted by a low-pass filter. In this manner, a high-pass filter characteristic is imparted to high level signals supplied to noise reduction circuit 40. In particular, when the level of the input signal is relatively low, feedback path 46 has little effect on such signal. In other words, for such low level signals, the gain of variable gain amplifier 43 is also relatively low so that the signal which is negatively fed back through low-pass filter 46 has little effect on the input signal from which it is subtracted in subtraction circuit 48. On the other hand, when the gain of variable gain amplifier 43 is relatively high for high level signals, low-pass filter 46 supplies a high level signal with the low frequency components thereof emphasized with respect to the high frequency components to subtraction circuit 48. Accordingly, subtraction circuit 48 supplies a high frequency emphasized signal to variable gain amplifier 43. This means that the high frequency region of the input signal supplied to noise reduction circuit 40 is further expanded for high level input signals, as shown in FIG. 11. As an example, low-pass filter 46 is of the type having a characteristic with two turn-over frequencies, for example, at 5 KHz in the low frequency range and 10 KHz in the high frequency range. As with the previously discussed circuits, the curves of FIG. 11 were generated when the responses of feedforward path 45 and feedback path 46 were set at −9.5 dB and 0 dB, respectively. It is to be noted that, with the circuit of FIG. 10 according to this invention, as a result of the expansion of the high frequency region for high levels of the input signal, there results an increase in the linear operating region of the tape and an improvement in the maximum output level (MOL), that is before saturation, that can be attained.

Figure 12:
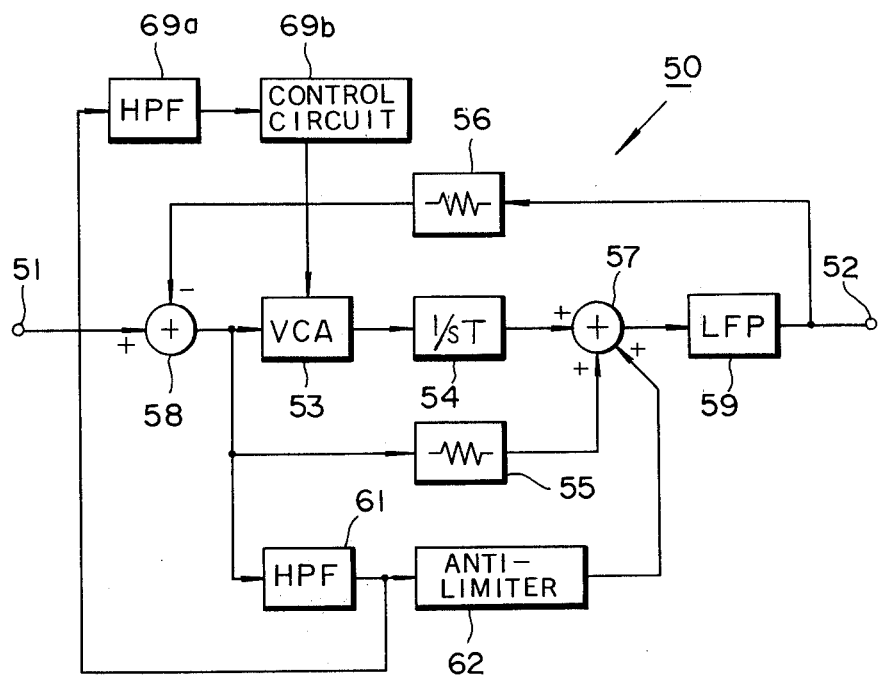
FIG. 12 is a block diagram of a noise reduction circuit according to another embodiment of the present invention.

Referring now to FIG. 12, there is shown another embodiment of a noise reduction circuit 50 according to this invention, in which elements 51–59 are identical in structure and function to elements 31–39 of noise reduction circuit 30 of FIG. 7 and accordingly, a detailed description thereof will be omitted herein for the sake of brevity. In addition to these elements, noise reduction circuit 50 includes another feedforward path connected in parallel with feedforward path 55, and which is comprised of a high-pass filter 61 supplied with the output from subtraction circuit 58 and an anti-limiting or coring circuit 62 supplied with the output of high-pass filter 61 and which, in turn, supplies an output to another adding or positive input of adder circuit 57. In addition, noise reduction circuit 50 includes a control path comprised of a high-pass filter 69a supplied with the output from high-pass filter 61 and a control circuit 69b supplied with the output from high-pass filter 69a and which, in turn, supplies a control voltage to variable gain amplifier 53 which, as previously discussed, is constituted by a voltage controlled amplifier. It should be appreciated that, in this embodiment, the weighting operation results from the two high-pass filters 61 and 69a.

Figure 13:
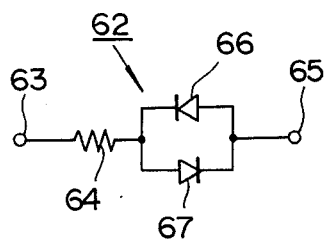
FIG. 13 is a circuit-wiring diagram of an anti-limiting circuit which can be used in the noise reduction circuit of FIG. 12.

An example of an anti-limiting circuit 62 that can be utilized in the circuit of FIG. 12 is shown in FIG. 13. In particular, anti-limiting circuit 62 of FIG. 13 includes a resistor 64 supplied with the output of high-pass filter 61 through an input terminal 63, and two oppositely-poled diodes 66 and 67 connected in parallel with each other and connected in series between resistor 64 and an output terminal 65 of anti-limiting circuit 62. The output of anti-limiting circuit 62 at output terminal 65 is supplied to the aforementioned adding input of adder circuit 57.

With noise reduction circuit 50 of FIG. 12, when the input signal level is suddenly increased, the gain of variable gain amplifier 53 is also increased. However, since the gain of variable gain amplifier 53 does not instantaneously follow the change in level of the input signal, there is a consequent delay in response thereof, which results in distortion of the processed waveform. If, for example, noise reduction circuit 50 is used in the negative feedback circuit of an amplifier to provide an encoding operation, when the input signal level is abruptly increased, a corresponding overshoot portion of the waveform is produced at the output of the amplifier, thereby causing saturation of the tape. The time within which this overshoot falls back to its desired level is called the attack time. Anti-limiting circuit 62 therefore functions to prevent such adverse effect and is rendered operative when the level of the input signal exceeds a predetermined level so as to compensate such signal. Also, since the aforementioned saturation of the magnetic tape most likely occurs at high frequencies of the input signal, high-pass filter 61 is provided in the second feedforward path between the output of subtraction circuit 58 and the input of anti-limiting circuit 62.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit for noise reduction comprising:
   a first signal path including variable gain amplifier means with controllable gain for amplifying a signal supplied thereto, and integrating means for integrating at least a portion of the signal passing through said variable gain amplifier means;
   means for controlling the gain of said variable gain amplifier means in response to the level of a signal in said first signal path;
   first means connected with said first signal path for providing a lower limit to the gain imparted by said variable gain amplifier means to a signal supplied to said circuit; and
   second means connected with said first signal path for providing an upper limit to the gain imparted by said variable gain amplifier means to said signal supplied to said circuit.

2. A circuit according to claim 1; in which said integrating means includes means for causing at least that portion of the signal passing through said variable gain amplifier means within a predetermined audio range to be integrated.

3. A circuit according to claim 1; in which said first signal path produces an output signal in response to an input signal supplied thereto, and said first means includes feedforward means for positively feeding forward said input signal to be combined with said output signal to form an added signal.

4. A circuit according to claim 3; in which said feedforward means includes a resistive element.

5. A circuit according to claim 3; further including adder means for combining said input signal which is fed forward by said feedforward means and said output signal from said first signal path to form said added signal.

6. A circuit according to claim 3; in which said second means includes feedback means for negatively feeding back said added signal to the input of said circuit.

7. A circuit according to claim 6; further including subtraction means for subtracting said negatively feedback signal from the signal supplied to said circuit to produce said input signal supplied to said first signal path.

8. A circuit according to claim 6; in which said feedback means includes a resistive element.

9. A circuit according to claim 6; in which said feedback means includes a low-pass filter circuit.

10. A circuit according to claim 6; further including low-pass filter means for supplying an output signal to said feedback means in response to said added signal.

11. A circuit according to claim 1; further including anti-limiting means connected in parallel with said first signal path for compensating the signal supplied to said circuit when the level of said signal is abruptly increased.

12. A circuit according to claim 1; further including amplifier means having an inverting input and an output; and in which said first signal path, said first means, said second means and said means for controlling form first decoder means connected as a negative feedback circuit for said amplifier means between the inverting input and the output thereof, wherein said circuit for noise reduction operates in an encoding mode.

13. A circuit according to claim 1; in which said variable gain amplifier means and said integrating means are connected in series, and said means for controlling includes level detecting means for controlling the gain of said variable gain amplifier means in response to the level of a signal from said first signal path.

14. A circuit according to claim 13; in which said variable gain amplifier means includes a voltage-controlled amplifier, and said level detecting means produces a gain control voltage in response to the voltage level of a signal from said first signal path and supplies said gain control voltage to said voltage-controlled amplifier for controlling the gain thereof.

15. A circuit according to claim 14; in which said means for controlling further includes weighting means for deriving a weighted signal from the high frequency components of a signal from said first signal path, and said level detecting means produces said gain control voltage from said weighted signal.

16. A circuit according to claim 14; in which said level detecting means causes the gain of said variable gain amplifier means to increase for increasing levels of said signal from said first signal path and to decrease for decreasing levels of said signal from said first signal path.

* * * * *